United States Patent
Kim et al.

(10) Patent No.: US 9,613,582 B2
(45) Date of Patent: Apr. 4, 2017

(54) GATE DRIVER INTEGRATED ON DISPLAY PANEL

(71) Applicant: Samsung Display Co., Ltd., Yongin, Gyeonggi-Do (KR)

(72) Inventors: Sung Man Kim, Seoul (KR); Jun Ho Song, Seongnam-si (KR); Beom Jun Kim, Seoul (KR); Seong Yeol Syn, Asan-si (KR); Young Je Cho, Asan-si (KR)

(73) Assignee: Samsung Display Co., Ltd. (KR)

( * ) Notice: Subject to any disclaimer, the term of this patent is extended or adjusted under 35 U.S.C. 154(b) by 47 days.

(21) Appl. No.: 14/340,396

(22) Filed: Jul. 24, 2014

(65) Prior Publication Data

US 2015/0213746 A1   Jul. 30, 2015

(30) Foreign Application Priority Data

Jan. 24, 2014   (KR) .................. 10-2014-0008734

(51) Int. Cl.
| | |
|---|---|
| G06F 3/038 | (2013.01) |
| G09G 5/00 | (2006.01) |
| G09G 3/36 | (2006.01) |
| G11C 19/28 | (2006.01) |

(52) U.S. Cl.
CPC ........... *G09G 3/3677* (2013.01); *G11C 19/28* (2013.01); *G09G 2300/0413* (2013.01); *G09G 2310/0286* (2013.01); *G09G 2320/041* (2013.01)

(58) Field of Classification Search
CPC ......... G09G 3/3677; G09G 2300/0413; G09G 2310/0286; G09G 2320/041; G11C 19/28

USPC ......................................................... 345/215
See application file for complete search history.

(56) References Cited

U.S. PATENT DOCUMENTS

| | | | |
|---|---|---|---|
| 7,081,890 | B2 | 7/2006 | Park et al. |
| 7,106,292 | B2 | 9/2006 | Moon |
| 7,336,254 | B2 | 2/2008 | Iwasaki et al. |
| 8,194,817 | B2 | 6/2012 | Tobita et al. |
| 2007/0274433 | A1 | 11/2007 | Tobita |
| 2009/0041177 | A1* | 2/2009 | Chien .............. G11C 19/28 377/64 |
| 2009/0122951 | A1* | 5/2009 | Tobita ............. G11C 19/28 377/68 |

(Continued)

FOREIGN PATENT DOCUMENTS

| | | |
|---|---|---|
| KR | 10-1137847 | 4/2012 |
| KR | 10-2013-0010714 | 1/2013 |

*Primary Examiner* — Mark Regn
(74) *Attorney, Agent, or Firm* — Innovation Counsel LLP

(57) ABSTRACT

Provided is a gate driver including a plurality of stages respectively transferring gate-on voltages to a plurality of gate lines. The stage includes a pull-up driver including a first transistor, the first transistor having a control terminal connected to a first node, an output terminal connected to a output terminal of a present stage and an input terminal connected to a first clock terminal, a first node pull-down portion including a second transistor, the second transistor having an input terminal connected to a buffer node, an output terminal connected to the first node and a control terminal connected to a second node, and a buffer node stabilizer including a third transistor, the third transistor having an input terminal and a control terminal connected to the first node, and an output terminal connected to the buffer node.

6 Claims, 12 Drawing Sheets

(56) References Cited

U.S. PATENT DOCUMENTS

| | | |
|---|---|---|
| 2010/0277206 A1 | 11/2010 | Lee et al. |
| 2011/0193836 A1 | 8/2011 | Umezaki |
| 2012/0139883 A1 | 6/2012 | Lee et al. |
| 2012/0162187 A1 | 6/2012 | Lee et al. |
| 2013/0027378 A1* | 1/2013 | Lee .................. G09G 3/3677 345/212 |
| 2013/0181747 A1 | 7/2013 | Yoon et al. |

* cited by examiner

GATE DRIVER INTEGRATED ON DISPLAY PANEL

CROSS-REFERENCE TO RELATED APPLICATION

This application claims priority to and the benefit of Korean Patent Application No. 10-2014-0008734 filed in the Korean Intellectual Property Office on Jan. 24, 2014, the entire contents of which are incorporated herein by reference.

BACKGROUND (a) Technical Field

The inventive concept relates to a display panel and a gate driver integrated on the display panel.

(b) Description of the Related Art

A liquid crystal display which is one of the most common types of flat panel displays currently in use includes two sheets of display panels with field generating electrodes such as a pixel electrode and a common electrode, and a liquid crystal layer interposed therebetween. The liquid crystal display generates an electric field in the liquid crystal layer by applying a voltage to the field generating electrodes, and determines the direction of liquid crystal molecules of the liquid crystal layer by the generated electric field, thus controlling polarization of incident light so as to display images. The display device may include an organic light emitting display device, a plasma display device, an electrophoretic display, and the like, in addition to the liquid crystal display.

The display device includes drivers such as a gate driver and a data driver. The gate driver among the drivers may be patterned together with a gate line, a data line, a thin film transistor, and the like to be integrated on the panel. As such, since the integrated gate driver is not required to use a separate gate driving chip, manufacturing cost is reduced.

In the gate driver integrated on the panel, there may be a problem in that a characteristic of a semiconductor of the thin film transistor, particularly, an amorphous semiconductor is changed according to a temperature. As a result, there may be a problem in that a gate voltage output at a high temperature does not have a predetermined waveform and a noise is generated, and there may be a problem in that the gate driver does not normally operate at a low temperature. Further, a leakage current in the thin film transistor is generated due to a ripple in the integrated gate driver, and as a result, there may be a problem in that an output characteristic of the gate driver deteriorates. Further, a width of a non-display area existing outside of the display area has to be decreased, and because the gate driver has to be integrated in the non-display area, there may be a problem in that it is difficult to reduce the width of the non-display area.

The above information disclosed in this Background section is only for enhancement of understanding of the background of the inventive concept and therefore it may contain information that does not form the prior art.

SUMMARY

The inventive concept has been made in an effort to provide a new structure of a gate driver integrated on a display panel.

Further, the inventive concept has been made in an effort to provide a gate driver with improved reliability.

An exemplary embodiment of the inventive concept provides a gate driver including a plurality of stages respectively transferring gate-on voltages to a plurality of gate lines. A stage may include a pull-up driver including a first transistor, the first transistor having a control terminal connected to a first node, an output terminal connected to a output terminal of a present stage and an input terminal connected to a first clock terminal, a first node pull-down portion including a second transistor, the second transistor having an input terminal connected to a buffer node, an output terminal connected to the first node and a control terminal connected to a second node, and a buffer node stabilizer including a third transistor, the third transistor having an input terminal and a control terminal connected to the first node, and an output terminal connected to the buffer node.

The stage may further includes an output pull-down portion having a fourth transistor, the fourth transistor having an input terminal connected to the output terminal of the present stage, an output terminal connected to a low voltage input terminal and a control terminal connected to a second clock terminal having an opposite phase to the first clock terminal, a reset portion including a fifth transistor, the fifth transistor having an input terminal connected to the second node, an output terminal connected to the low voltage input terminal and a control terminal connected to the first node. The first node pull down portion may further include a sixth transistor, the sixth transistor having an input terminal connected to the buffer node, an output terminal connected to the low voltage input terminal and a control terminal connected to the second node. The low voltage input terminal may include a first low voltage input terminal and a second low voltage input terminal, the second low voltage input terminal having a voltage lower than the first low voltage input terminal. The output terminal of the fourth transistor and the output terminal of the fifth transistor may be connected to the first low voltage input terminal, and the output terminal of the sixth transistor may be connected to the second low voltage input terminal.

The stage may further include a first node pull-up portion having a seventh transistor and a eighth transistor serially connected, wherein the seventh transistor having an input terminal connected to a first DC voltage input terminal, an output terminal connected to an input terminal of the eighth transistor and a control terminal connected to an output terminal of a previous stage, and wherein the eighth transistor having an input terminal connected to the output terminal of the seventh transistor, an output terminal connected to the first node and a control terminal connected to a first node of the previous stage.

The stage may further include a first node reset portion having a ninth transistor and a tenth transistor serially connected. The ninth transistor may have an input terminal connected to a second DC voltage input terminal, an output terminal connected to an input terminal of the tenth transistor and a control terminal connected to an output terminal of a subsequent stage. The tenth transistor may have an input terminal connected to the output terminal of the ninth transistor, an output terminal connected to the second node and a control terminal connected to a first node of the subsequent stage.

The stage may further include an output pull-down portion having a fourth transistor, the fourth transistor having an input terminal connected to the output terminal of the stage, an output terminal connected to a low voltage input terminal and a control terminal connected to a second clock terminal having an opposite phase to the first clock terminal, and a reset portion including a fifth transistor, the fifth transistor having an input terminal connected to the second node, an output terminal connected to the low voltage input terminal and a control terminal connected to the first node. The first node pull down portion may further include a sixth transistor, the sixth transistor having an input terminal connected to the buffer node, an output terminal connected to the low voltage input terminal and a control terminal connected to the second node. The low voltage input terminal may include a first low voltage input terminal and a second low voltage input terminal, the second low voltage input terminal having a voltage lower than the first low voltage input terminal. The output terminal of the fourth transistor may be connected to the first low voltage input terminal, and the output terminal of the fifth transistor and the output terminal of the sixth transistor may be connected to the second low voltage input terminal.

Another exemplary embodiment of the present invention provides a gate driver including a plurality of stages respectively transferring gate-on voltages to a plurality of gate lines, in which a stage may include a pull-up driver including a first transistor, the first transistor having a control terminal connected to a first node, an output terminal connected to a output terminal of a present stage and an input terminal connected to a first clock terminal, a first node pull-down portion including a second transistor, the second transistor having an input terminal connected to a buffer node, an output terminal connected to the first node and a control terminal connected to a second node, and a first node reset portion having a third transistor and a fourth transistor serially connected, wherein the third transistor having an input terminal connected to a second DC voltage input terminal, an output terminal connected to an input terminal of the fourth transistor and a control terminal connected to an output terminal of a subsequent stage, and wherein the fourth transistor having an input terminal connected to an output terminal of the third transistor, an output terminal connected to the second node and a control terminal connected to a first node of the subsequent stage. The stage may further include an output pull-down portion having a fifth transistor, the fifth transistor having an input terminal connected to the output terminal of the present stage, an output terminal connected to a low voltage input terminal and a control terminal connected to a second clock terminal having an opposite phase to the first clock terminal, and a reset portion including a sixth transistor, the sixth transistor having an input terminal connected to the second node, an output terminal connected to the low voltage input terminal and a control terminal connected to the first node. The first node pull down portion may further include a seventh transistor, the seventh transistor having an input terminal connected to the buffer node, an output terminal connected to the low voltage input terminal and a control terminal connected to the second node. The low voltage input terminal may include a first low voltage input terminal and a second low voltage input terminal, the second low voltage input terminal having a voltage lower than the first low voltage input terminal. The output terminal of the fifth transistor may be connected to the first low voltage input terminal, and the output terminal of the sixth transistor is connected to the second low voltage input terminal. The output terminal of the seventh transistor may be connected to the second low voltage input terminal.

Another exemplary embodiment of the present invention provides a gate driver including a plurality of stages respectively transferring gate-on voltages to a plurality of gate lines, in which a stage may include a pull-up driver including a first transistor and a capacitor, the first transistor having a control terminal connected to a first node, an output terminal connected to a output terminal of a present stage and an input terminal connected to a first clock terminal, the capacitor being connected between the first node and the output terminal of the present stage, a first node pull-down portion including a second transistor and a third transistor, the second transistor having an input terminal connected to a buffer node, an output terminal connected to the first node and a control terminal connected to a second node, the third transistor having an input terminal connected to a buffer node, an output terminal connected to a low voltage input terminal and a control terminal connected to a second node, a buffer node stabilizer including a fourth transistor, the fourth transistor having an input terminal and a control terminal connected to the first node, and an output terminal connected to the buffer node, an output pull-down portion having a fifth transistor, the fifth transistor having an input terminal connected to the output terminal of the stage, an output terminal connected to a low voltage input terminal and a control terminal connected to a second clock terminal having an opposite phase to the first clock terminal, a reset portion including a sixth transistor, the sixth transistor having an input terminal connected to the second node, an output terminal connected to the low voltage input terminal and a control terminal connected to the first node, a first node pull-up portion having a seventh transistor and a eighth transistor serially connected, wherein the seventh transistor having an input terminal connected to a first DC voltage input terminal, an output terminal connected to an input terminal of the eighth transistor and a control terminal connected to an output terminal of a previous stage, and wherein the eighth transistor having an input terminal connected to the output terminal of the seventh transistor, an output terminal connected to the first node and a control terminal connected to a first node of the previous stage, and a first node reset portion having a ninth transistor and a tenth transistor serially connected, wherein the ninth transistor having an input terminal connected to a second DC voltage input terminal, an output terminal connected to an input terminal of the tenth transistor and a control terminal connected to an output terminal of a subsequent stage, and wherein the tenth transistor having an input terminal connected to the output terminal of the ninth transistor, an output terminal connected to the second node and a control terminal connected to a first node of the subsequent stage.

According to the exemplary embodiment of the inventive concept, the gate driver may reduce a boost-up interference element by reducing or removing a voltage difference between a Q node and a Q1 node in each stage.

Further, it is possible to increase a voltage of a control terminal of a transistor taking charge of a carry output to improve an output capacity, or remove a transistor to reduce the width of the gate driver.

Further, a low voltage applied to the Q node is differently applied to be lower than a low voltage applied to an O node which is the output terminal to thereby improve leakage of the transistor and improve long-term reliability and power consumption.

DETAILED DESCRIPTION OF THE EMBODIMENTS

Figure 1:
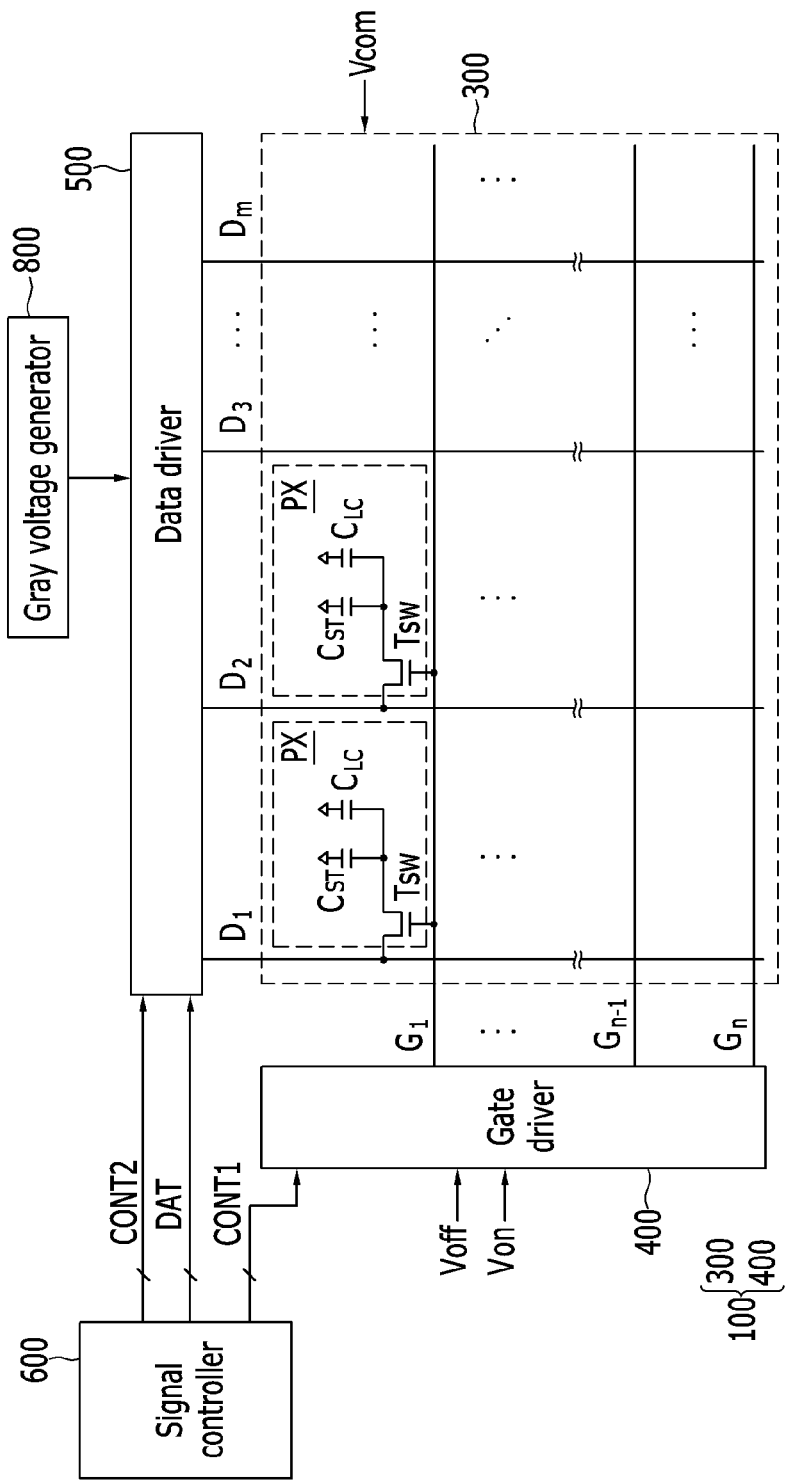
FIG. 1 is a block diagram of a display device according to an exemplary embodiment of the inventive concept.

The inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the inventive concept.

Like reference numerals designate like elements throughout the specification. It will be understood that when an element such as a layer, film, region, or substrate is referred to as being "on" another element, it can be formed directly on the other element or be formed with intervening elements. In contrast, when an element is referred to as being "directly on" another element, there are no intervening elements present.

Hereinafter, a display device according to an exemplary embodiment of the inventive concept will be described in detail with reference to the accompanying drawings.

FIG. 1 is a block diagram of a display device according to an exemplary embodiment of the inventive concept.

Referring to FIG. 1, a display panel 100 according to an exemplary embodiment of the inventive concept includes a display area 300 displaying an image, and a gate driver 400 applying a gate voltage to a gate line of the display area 300. The gate driver 400 is integrated on the display panel 100.

The data line of the display area 300 receives a data voltage from a data driver 500 which is formed on a flexible printed circuit (FPC) film attached to the display panel 100.

The gate driver 400 and the data driver 500 are controlled by a signal controller 600.

A printed circuit board (PCB) including the signal controller may be connected to the FPC film to transfer signals from the signal controller 600 to the data driver 500 and the gate driver 400. The signals provided from the signal controller 600 include signals such as a first clock signal CKV, a second clock signal CKVB, and a scanning start signal STVP, and signals providing specific voltages VGL, VGH, Vcom, Vcst, DIR, and DIRB.

The display area 300 includes pixels PX arranged in a matrix form. A liquid crystal panel is illustrated in FIG. 1 as an example. Meanwhile, an organic light emitting panel includes a thin film transistor and an organic light emitting diode, and other display panels include elements such as a thin film transistor to form the display area 300. Hereinafter, the liquid crystal panel will be described as an example.

The display area 300 includes a plurality of gate lines G1-Gn and a plurality of data lines D1-Dm. The plurality of gate lines G1-Gn and the plurality of data lines D1-Dm cross each other with an intervening insulating layer.

Each pixel PX includes a thin film transistor Tsw, a liquid crystal capacitor Clc, and a storage capacitor Cst. A control terminal of the thin film transistor Tsw is connected to one gate line, an input terminal of the thin film transistor Tsw is connected to one data line, and an output terminal of the thin film transistor Tsw is connected to one terminal of the liquid crystal capacitor Clc and one terminal of the storage capacitor Cst. The other terminal of the liquid crystal capacitor Clc is connected to a common electrode, and the other terminal of the storage capacitor Cst receives a storage voltage Vcst applied from the signal controller 600.

The plurality of data lines D1-Dm receives data voltages from the data driver 500, and the plurality of gate lines G1-Gn receives gate voltages from the gate driver 400.

The data driver 500 is formed at an upper side or a lower side of the display panel 100 to be connected with the data lines D1-Dm extending in a vertical direction, and selects a corresponding data voltage among gray voltages generated from a gray voltage generator 800 to apply the corresponding data voltage to the data lines D1-Dm.

The gate driver 400 alternatively applies gate-on voltages Von and gate-off voltages Voff to the gate lines G1-Gn, and the gate-on voltages Von are sequentially applied to the gate lines G1-Gn.

The gate driver 400 receives the clock signals CKV and CKVB, the scanning start signal STVP, a low voltage corresponding to the gate-off voltage, and a pair of DC voltages DIR and DIRB to generate the gate voltages (the gate-on voltage Von and the gate-off voltage Voff), and sequentially applies the gate-on voltages Von to the gate lines G1-Gn.

Hereinabove, the entire structure of the display device including the display panel 100 is described.

Hereinafter, the gate driver 400 and the gate lines G1-Gn related with the inventive concept will be mainly described.

Figure 2:
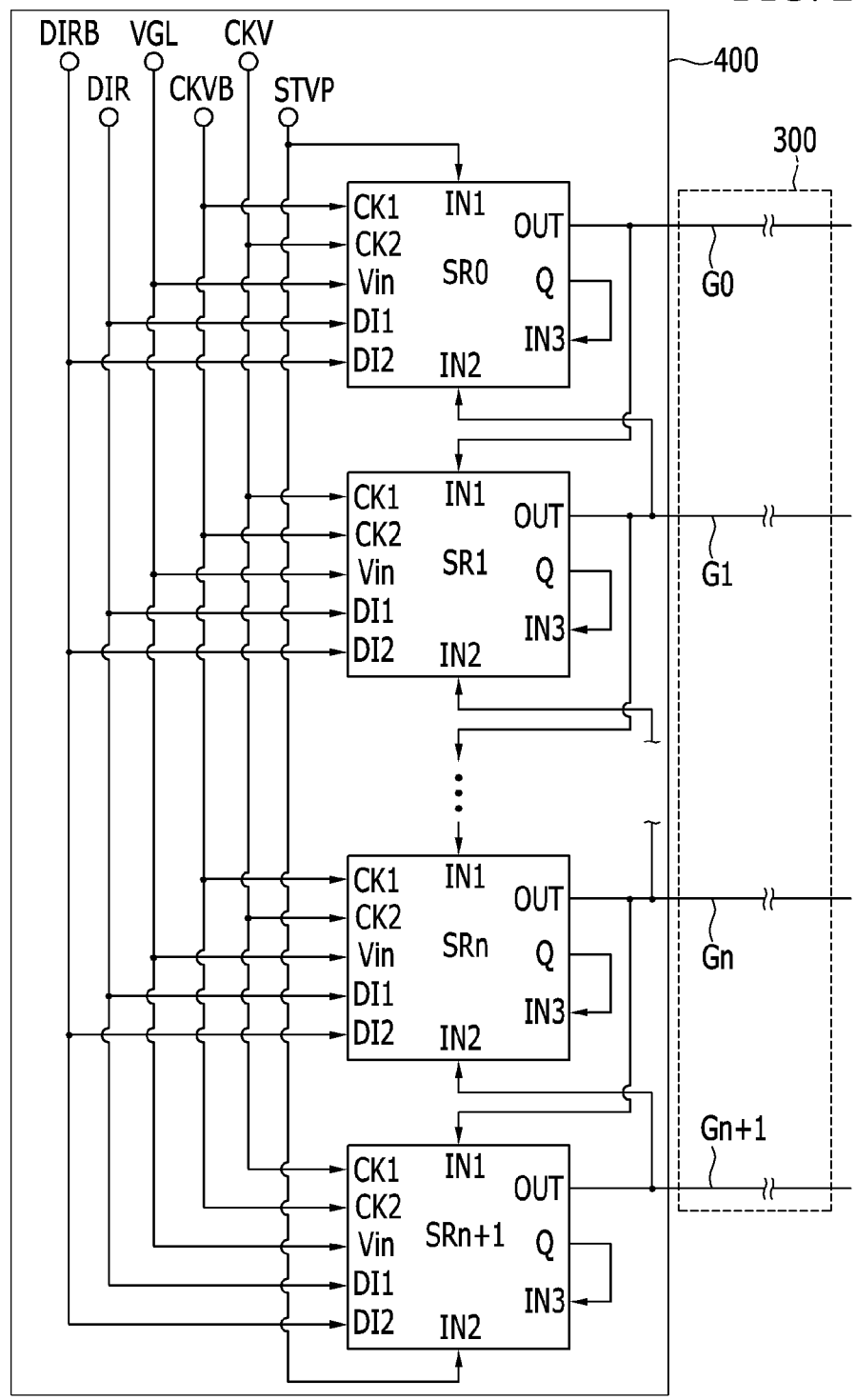
FIG. 2 is a block diagram illustrating a gate driver and a gate line in detail according to the exemplary embodiment of the inventive concept.

FIG. 2 is a block diagram illustrating a gate driver and a gate line in detail according to the exemplary embodiment of the inventive concept.

First, the number of gate lines formed in the display panel 100 according to the exemplary embodiment of the inventive concept may be n+2. The number of gate lines in the display area 300 is a total of n, but two dummy gate lines exist at the outside of the display area 300. In the exemplary embodiment of the inventive concept, the dummy gate lines are G0 and Gn+1. A 0-th gate line G0 exists at an upper side of a first gate line G1, and an n+1-th gate line Gn+1 exists at a lower side of an n-th gate line Gn. According to an exemplary embodiment, the number of dummy gate lines may vary in accordance with a design of the display panel 100.

First, the gate driver 400 includes a plurality of stages SR0-SRn+1 which is dependently connected to each other. Each of the stages SR0-SRn+1 includes three input terminals IN1, IN2, and IN3, two clock input terminals CK1 and CK2, a voltage input terminal Vin receiving a low voltage corresponding to the gate-off voltage, a pair of DC voltage terminals DI1 and DI2 receiving a pair of DC voltages DIR and DIRB, respectively, a Q node terminal Q, and an output terminal OUT.

First, the first input terminal IN1 is connected to an output terminal OUT of a previous stage to receive a front gate voltage which is a carry signal. Next, the 0-th stage SR0 (dummy stage) receives the scanning start signal STVP in the first input terminal IN1 because the front stage does not exist.

The second input terminal IN2 is connected to an output terminal OUT of a subsequent stage to receive an output voltage of the subsequent stage as a reset signal. Here, the n+1-th stage SRn+1 (dummy stage) formed at the end of the stages receives the scanning start signal STVP as a reset signal because the subsequent stage does not exist.

The third input terminal IN3 is connected to a Q node of a current stage to receive a current Q node voltage.

A first clock signal CKV is applied to a first clock input terminal CK1 of an odd numbered stage among the plurality of stages, and a second clock signal CKVB having an opposite phase to the first clock signal CKV is applied to a second clock input terminal CK2. The second clock signal CKVB is applied to a first clock input terminal CK1 of an even numbered stage, and the first clock signal CKV is applied to a second clock input terminal CK2 of the even numbered stages. As a result, the phase of a clock of the even numbered stages is opposite to that of the odd numbered stages. Here, values of the first clock signal CKV and the second clock signal CKVB are changed every 1 horizontal period 1H to have 2H as a cycle, and the two clock signals have opposite phases. The clock signals CKV and CKVB may be the same as the gate-on voltage in the case of a high voltage level, and may be the same as the gate-off voltage in the case of a low voltage level.

A low voltage VGL corresponding to the gate-off voltage is applied to the voltage input terminal Vin, and the pair of DC voltages DIR and DIRB are applied to each of the pair of DC voltage terminals DI1 and DI2. One of the pair of DC voltages DIR and DIRB is a high voltage, the other one is a low voltage, and the low voltage may be the same as the low voltage input to the voltage input terminal Vin. For example, the high voltage is 20 V, and the low voltages applied to the voltage input terminal Vin and one of the DC voltage terminals DI1 and DI2 are the same as −6 V. In a forward mode in which a gate on voltage is sequentially applied to the gate lines from the first gate line G1 to the n-th gate line Gn, DIR becomes high voltage and DIRB becomes low voltage. Meanwhile, in a reverse mode in which a gate on voltage is sequentially applied to the gate lines from the n-th gate line Gn to the first gate line G1, DIR becomes low voltage and DIRB becomes high voltage.

The dummy stages SR0 and SRn+1 are stages that generate and output dummy gate voltages unlike other stages SR1-SRn. While the gate voltages output from the other stages SR1-SRn are transferred through the gate lines, the data voltages are applied to the pixels to display the images. The dummy stages SR0 and SRn+1 may not be connected to the gate lines. Even when the dummy stages SR0 and SRn+1 are connected to the dummy gate lines G0 and Gn+1 (not illustrated), the dummy gate lines G0 and Gn+1 are not used to display the images. Because the gate driver 400 according to the exemplary embodiment of the inventive concept has two modes, the forward mode and the backward mode, the two dummy stages SR0 and SRn+1 is needed at upper and lower sides.

An operation of the gate driver 400 will be described below.

First, the forward mode will be described.

The 0-th stage SR0 receives the second clock signal CKVB through the first clock input terminal CK1, the first clock signal CKV through the second clock input terminal CK2, the scanning start signal STVP through the first input terminal IN1, the low voltage through the voltage input terminal Vin and the second DC voltage terminal DI2, and the high voltage through the first DC voltage terminal DI1, respectively, to output the gate-on voltage to the 0-th gate line G0 (dummy gate line) and the first input terminal IN1 of the first stage SR1 from the output terminal OUT and output the Q node voltage to the third input terminal IN3 of the 0-th stage SR0 from the Q node terminal Q.

Thereafter, the first stage SR1 receives the first clock signal CKV through the first clock input terminal CK1, the second clock signal CKVB through the second clock input terminal CK2, the gate-on voltage of the 0-th stage SR0 through the first input terminal IN1, the low voltage through the voltage input terminal Vin and the second DC voltage terminal DI2, and the high voltage through the first DC voltage terminal DI1, respectively, to output the gate-on voltage to the first gate line G1, the first input terminal IN1 of the second stage SR2, and the second input terminal IN2 of the 0-th stage SR0 from the output terminal OUT and output the Q node voltage to the third input terminal IN3 of the first stage SR1 from the Q node terminal Q.

The gate-on voltage of the first stage SR1 applied to the second input terminal IN2 of the 0-th stage SR0 prevents the 0-th stage SR0 from outputting the gate-on voltage through the output terminal OUT any more.

In the same method as described above, the n-th stage SRn receives the second clock signal CKVB through the first clock input terminal CK1, the first clock signal CKV through the second clock input terminal CK2, the gate-on voltage of the n−1-th stage SRn−1 through the first input terminal IN1, the low voltage through the voltage input terminal Vin and the second DC voltage terminal DI2, and the high voltage through the first DC voltage terminal DI1, respectively, to output the gate-on voltage to the n-th gate line Gn, the first input terminal IN1 of the first stage SRn+1, and the second input terminal IN2 of the n−1-th stage SRn−1 from the output terminal OUT and output the Q node voltage to the third input terminal IN3 of the n-th stage SRn from the Q node terminal Q.

Thereafter, the n+1-th stage SRn+1 receives the first clock signal CKV through the first clock input terminal CK1, the second clock signal CKVB through the second clock input terminal CK2, the gate-on voltage of the n-th stage SRn through the first input terminal IN1, the low voltage through the voltage input terminal Vin and the second DC voltage terminal DI2, and the high voltage through the first DC voltage terminal DI1, respectively, to output the gate-on voltage to the n+1-th gate line Gn+1 (dummy gate line) and the second input terminal IN2 of the n-th stage SRn from the output terminal OUT and output the Q node voltage to the third input terminal IN3 of the n+1-th stage SRn+1 from the Q node terminal Q.

The gate-on voltage of the n+1-th stage SRn+1 applied to the second input terminal IN2 of the n-th stage SRn prevents the n-th stage SRn from outputting the gate-on voltage through the output terminal OUT any more.

According to the order described above, the gate-on voltages are sequentially applied to all the gate lines G1-Gn in the forward direction.

Meanwhile, in the backward mode, unlike the forward mode, the low voltage is applied to the first DC voltage terminal DI1, and the high voltage is applied to the second DC voltage terminal DI2. That is, the low voltage as the DIR voltage is applied, and the high voltage as the DIRB voltage is applied.

Further, in the backward mode, the n+1-th stage SRn+1 operates first, and the 0-th stage SR0 operates last.

That is, the n+1-th stage SRn+1 receives the first clock signal CKV through the first clock input terminal CK1, the second clock signal CKVB through the second clock input terminal CK2, the scanning start signal STVP through the second input terminal IN2, the low voltage through the voltage input terminal Vin and the first DC voltage terminal DI1, and the high voltage through the second DC voltage terminal DI2, respectively, to output the gate-on voltage to the n+1-th gate line Gn+1 (dummy gate line) and the second input terminal IN2 of the n-th stage SRn from the output terminal OUT and output the Q node voltage to the third input terminal IN3 of the n+1-th stage SRn+1 from the Q node terminal Q.

Thereafter, the n-th stage SRn receives the second clock signal CKVB through the first clock input terminal CK1, the first clock signal CKV through the second clock input terminal CK2, the gate-on voltage of the n+1-th stage SRn+1 through the second input terminal IN2, the low voltage through the voltage input terminal Vin and the first DC voltage terminal DI1, and the high voltage through the second DC voltage terminal DI2, respectively, to output the gate-on voltage to the n-th gate line Gn, the first input terminal IN1 of the n+1-th stage SRn+1, and the second input terminal IN2 of the n−1-th stage SRn−1 from the output terminal OUT and output the Q node voltage to the third input terminal IN3 of the n-th stage SRn from the Q node terminal Q.

The gate-on voltage of the n-th stage SRn applied to the first input terminal IN1 of the n+1-th stage SRn+1 prevents the n+1-th stage SRn+1 from outputting the gate-on voltage through the output terminal OUT any more.

In the same method as described above, the first stage SR1 receives the first clock signal CKV through the first clock input terminal CK1, the second clock signal CKVB through the second clock input terminal CK2, the gate-on voltage of the second stage SR2 through the second input terminal IN2, the low voltage through the voltage input terminal Vin and the first DC voltage terminal DI1, and the high voltage through the second DC voltage terminal DI2, respectively, to output the gate-on voltage to the first gate line G1, the first input terminal IN1 of the second stage SR2, and the second input terminal IN2 of the 0-th stage SR0 from the output terminal OUT and output the Q node voltage to the third input terminal IN3 of the first stage SR1 from the Q node terminal Q.

Thereafter, the 0-th stage SR0 receives the second clock signal CKVB through the first clock input terminal CK1, the first clock signal CKV through the second clock input terminal CK2, the gate-on voltage of the first stage SR1 through the second input terminal IN2, the low voltage through the voltage input terminal Vin and the first DC voltage terminal DI1, and the high voltage through the second DC voltage terminal DI2, respectively, to output the gate-on voltage to the 0-th gate line G0 (dummy gate line) and the first input terminal IN1 of the first stage SR1 from the output terminal OUT and output the Q node voltage to the third input terminal IN3 of the 0-th stage SR0 from the Q node terminal Q.

The gate-on voltage of the 0-th stage SR0 applied to the first input terminal IN1 of the first stage SR1 prevents the first stage SR1 from outputting the gate-on voltage through the output terminal OUT any more.

According to the order described above, the gate-on voltages are sequentially applied to all the gate lines G1-Gn in the backward direction.

The entire structure of the gate driver 400 is described through FIG. 2. Hereinafter, a structure and an operation of one stage connected to one gate line will be described in more detail with reference to FIG. 3.

Figure 3:
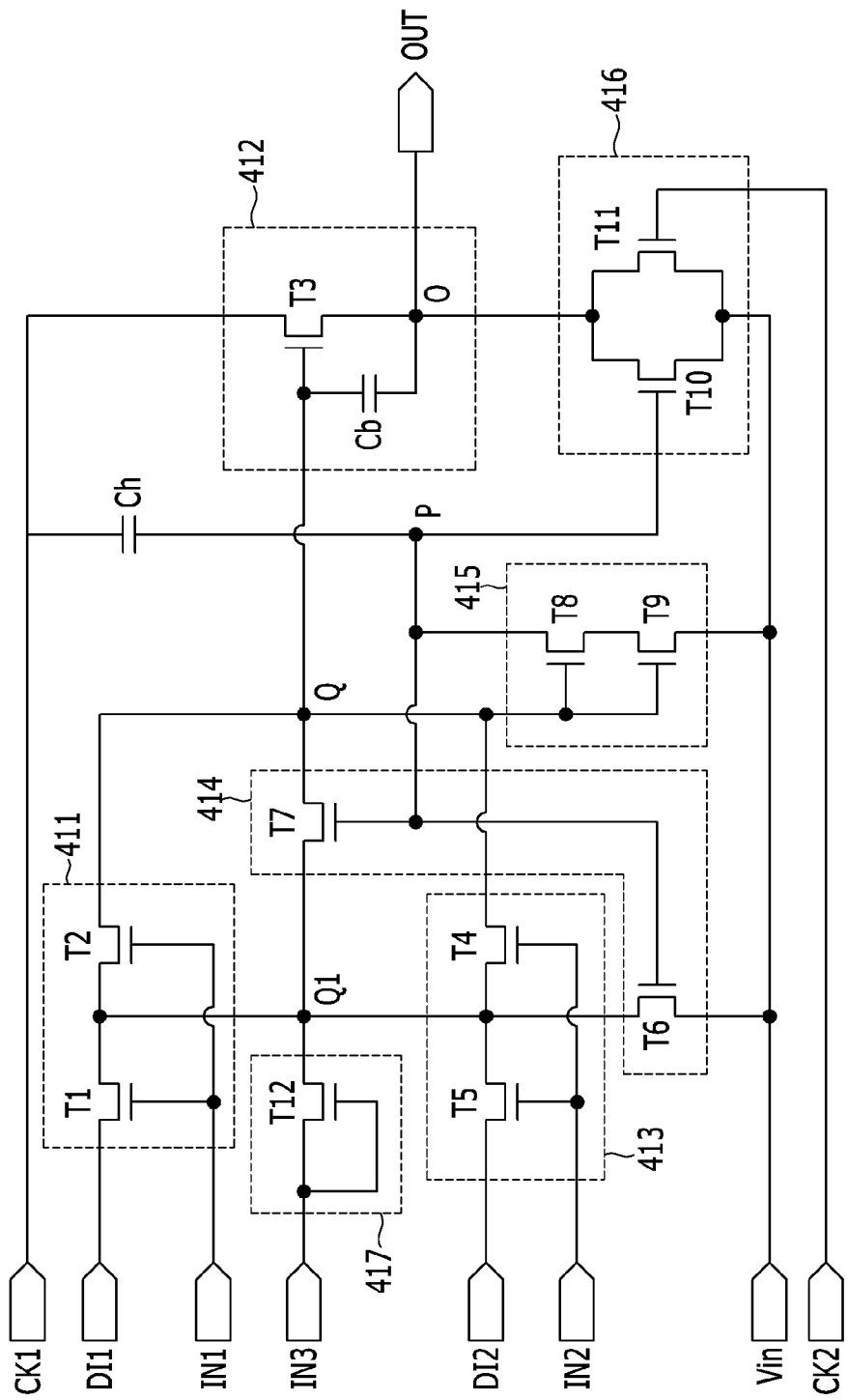
FIG. 3 is a circuit diagram illustrating one stage according to the exemplary embodiment of the inventive concept.
Figure 4:
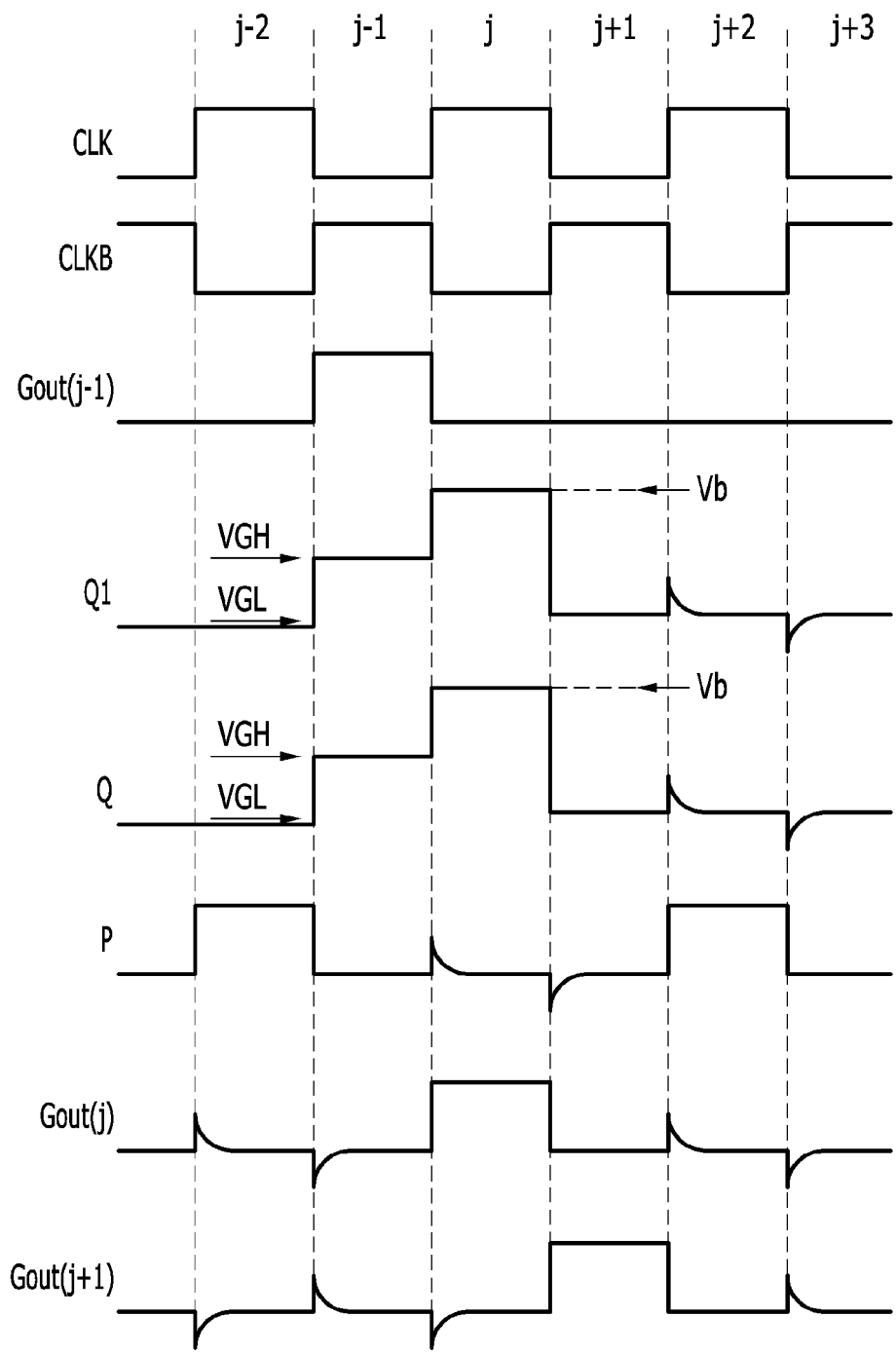
FIG. 4 is a signal waveform diagram related with the stage of FIG. 3.

FIG. 3 is a circuit diagram illustrating one stage according to the exemplary embodiment of the inventive concept, and FIG. 4 is a signal waveform diagram related with the stage of FIG. 3.

Referring to FIG. 3, each stage SR of the gate driver 400 includes a pull-up driver 412, an output pull-down portion 416, a reset portion 415, a Q node pull-up portion 411, a Q node pull-down portion 414, a Q node reset portion 413, and a buffer node stabilizer 417.

The above names are designated supposing the gate driver is in the forward mode where a direct current of the high voltage is applied as the DIR voltage, and a direct current (VGL voltage) of the low voltage is applied as the DIRB voltage. The names and the operation may be different in the backward mode.

The pull-up driver 412 is a portion which generates and outputs the gate-on voltage to a gate line. The pull-up driver 412 is connected to the output terminal OUT, the Q node, and the first clock input terminal CK1, and includes a T3 transistor and a Cb capacitor. A control terminal of the T3 transistor is connected to the Q node, an input terminal is connected to the first clock input terminal CK1, and an output terminal is connected to the output terminal OUT. The Cb capacitor is connected to the control terminal and the output terminal of the T3 transistor, and serves to store the voltage of the Q node. Referring to FIG. 4, for example, in a j-th stage SRj which is the current stage, when a gate-on voltage corresponding to a high voltage VGH is applied to the Q node for a j−1-th period and thus the clock signal is changed from a low value to a high value through the first clock input terminal CK1 for a j-th period while the high voltage is stored in the Cb capacitor, the voltage of the Q node which is the control terminal of the T3 transistor is boosted-up to Vb (VGH+the changed value of the clock signal), and the gate-on voltage is output to the output terminal OUT. In FIG. 4, Gout(j) is an output gate signal of a current stage SRj, Gout(j−1) is an output gate signal of a front stage SRj−1, and Gout(j+1) is an output gate signal of a subsequent stage SRj+1.

The output pull-down portion 416 serves to change the voltage of the O node connected with the output terminal OUT to the low voltage. The output pull-down portion 416 is connected to the O node, a P node, the voltage input terminal Vin, and the second clock input terminal CK2, and includes a T10 transistor and a T11 transistor. A control terminal of the T10 transistor is connected to the P node, an input terminal is connected to the O node, and an output terminal is connected to the voltage input terminal Vin. A control terminal of the T11 transistor is connected to the second clock input terminal CK2, an input terminal is connected to the O node, and an output terminal is connected to the voltage input terminal Vin.

Since phases of the clock signal input from the second clock input terminal CK2 and the clock signal input from the first clock input terminal CK1 are opposite, when 1H elapses after the gate-on voltage is output, the T11 transistor is turned on, and while the voltage of the O node is discharged through the T11 transistor to the low voltage, the output of the gate-on voltage stops. Meanwhile, the voltage of the P node to which the clock signal input to the first clock input terminal CK1 is transferred through the Ch capacitor may be changed periodically according to the clock signal, but maintains a low voltage state while the gate-on voltage is output from the current stage SRj, as illustrated in FIG. 4 (see an operation of the reset portion 415 to be described below).

The reset portion 415 changes the voltage value of the P node into the low voltage while the boost-up voltage is applied to the Q node to prevent the Q node pull-down portion 414 and the T10 transistors of the output pull-down portion 416 from operating. The reset portion 415 is connected to the voltage input terminal Vin, the P node, and the Q node, and includes a T8 transistor and a T9 transistor. A control terminal of the T8 transistor is connected to the Q node, an input terminal is connected to the P node, and an output terminal is connected to an input terminal of the T9 transistor. A control terminal of the T9 transistor is connected to the Q node, an input terminal is connected to the output terminal of the T8 transistor, and an output terminal is connected to the voltage input terminal Vin. That is, both the control terminals of the two transistors T8 and T9 included in the reset portion 415 are connected to the Q node, and the control node of the reset portion 415 is the Q node.

Hereinafter, the Q node pull-up portion 411, the Q node pull-down portion 414, and the Q node reset portion 413 will be described.

The Q node pull-up portion 411 serves to increase the voltage of the Q node of the stage SRj (which is the control terminal of the T3 transistor of the pull-up driver 412) to the DIR voltage (that is, the high voltage). The Q node pull-up portion 411 is connected to the first DC voltage terminal DI1, the first input terminal IN1, the Q node, and the Q1 node, and includes a T1 transistor and a T2 transistor. A control terminal of the T1 transistor is connected to the first input terminal IN1, an input terminal is connected to the first DC voltage terminal DI1, and an output terminal is connected to the Q1 node. A control terminal of the T2 transistor is connected with the first input terminal IN1, an input terminal is connected to the output terminal of T1 transistor, that is, the Q1 node, and an output terminal is connected to the Q node. When the gate-on voltage of the front stage SRj−1 is applied to the first input terminal IN1, the gate-on voltage is applied to the control terminals of the two transistors T1 and T2 and the DIR voltage (high voltage) is transferred to the Q node through the T1 transistor and the T2 transistor, and as a result, the Q node pull-up portion 411 pulls-up the voltage of the Q node to the high voltage. Further, the output terminal of the T1 transistor of the Q node pull-up portion 411 transfers the DIR voltage (high voltage) to the Q1 node (buffer node).

The Q node pull-down portion 414 serves to decrease the voltage of the Q node to the low voltage corresponding to the gate-off voltage. The Q node pull-down portion 414 is connected to the Q node, the Q1 node, the P node, and the voltage input terminal Vin, and includes a T6 transistor and a T7 transistor. A control terminal of the T6 transistor is connected to the P node, an input terminal is connected to the Q1 node, and an output terminal is connected to the voltage input terminal Vin. A control terminal of the T7 transistor is connected to the P node, an input terminal is connected to the Q node, and an output terminal is connected to the input terminal of the T6 transistor, that is, the Q1 node. The Q node pull-down portion 414 discharges the voltage of the Q node to the low voltage through the T6 transistor and the T7 transistor, when the voltage of the P node is high. Here, the voltage of the P node to which the clock signal input to the first clock input terminal CK1 is transferred through the Ch capacitor may be changed periodically according to the clock signal, but maintains a low voltage state while the gate-on voltage is output from the current stage SRj. Further, since the P node is connected to the control terminal of the T10 transistor of the output pull-down portion 416, the Q node pull-down portion 414 and the T10 transistor of the output pull-down portion 416 operate at the same time.

The Q node reset portion 413 serves to decrease the voltage of the Q node to the DIRB voltage (low voltage), when the gate-on voltage of the subsequent stage SRj+1 is applied. The Q node reset portion 413 is connected to the second input terminal IN2, the second DC voltage terminal DI2, the Q node, and the Q1 node, and includes a T4 transistor and a T5 transistor. A control terminal of the T4 transistor is connected to the second input terminal IN2, an input terminal is connected to the Q node, and an output terminal is connected to the Q1 node. A control terminal of the T5 transistor is connected to the second input terminal IN2, an input terminal is connected to the output terminal of the T4 transistor, that is, the Q1 node, and an output terminal is connected to the second DC voltage terminal DI2. When the gate-on voltage of the subsequent stage SRj+1 is applied through the second input terminal IN2, the T4 transistor and the T5 transistor are turned on and thus the voltage of the Q node is decreased to the low voltage to prevent the pull-up driver 412 from outputting the gate-on voltage any more.

Roles of the Q node pull-down portion 414 and the Q node reset portion 413 are similar to each other, but driving timings thereof are different from each other. Further, in the backward mode, the roles of the Q node reset portion 413 and the Q node pull-up portion 411 are changed. The backward mode will be separately described below.

Meanwhile, the buffer node stabilizer 417 serves to stabilize the Q1 node (buffer node) because the Q1 node is floated while the current stage SRj operates and thus the voltage may not be stabilized. That is, after the high voltage is applied to the Q1 node through T1 transistor according to the output of the previous stage IN1, the low voltage is applied to the Q1 node through the T5 transistor according to the output of the subsequent stage IN2. While the gate-on voltage is applied from the current stage SRj, which is located between the front stage SRj−1 and the rear stage SRj+1, the Q1 node is floated. The Q node voltage of the current stage SRj needs to be applied to the Q1 node through the buffer node stabilizer 417 in order to stabilize the Q1 node. The buffer node stabilizer 417 is connected between the third input terminal IN3 and the Q1 node, and includes a diode-connected T12 transistor. The T12 transistor is diode-connected, and the third input terminal IN3 is connected to a control terminal and an input terminal, and the Q1 node is connected to an output terminal. As a result, when the Q1 node voltage is input through the third input terminal IN3, the Q1 node voltage is transferred to the Q1 node through the diode-connected T12 transistor to be maintained and stabilized at the Q node voltage. Since the Q1 node voltage is maintained substantially the same as the Q node voltage, a voltage difference between the Q1 node and the Q node is not nearly generated, and as a result, the leakage current, which is leaked from the Q node to the Q1 node through the transistors T2, T4, and T7 connected between the Q1 node and the Q node, may be prevented from flowing through the transistors T2, T4, and T7.

Meanwhile, the stage SRj includes the Ch capacitor connected between the P node and the first clock input terminal CK1. The Ch capacitor prevents the clock signal input from the first clock input terminal CK1 from being directly transferred to the P node.

Hereinabove, the operation of one stage in the forward mode is mainly described. Hereinafter, an operation in a backward mode will be described, and the different between the forward mode and the backward mode will be mainly described.

In the backward mode, the low voltage is applied through the first DC voltage terminal DI1, and the high voltage is applied through the second DC voltage terminal DI2. Further, the current stage generates and outputs the gate-on voltage by the gate-on voltage transferred through the second input terminal IN2, and the current stage does not output the gate-on voltage any more by the gate-on voltage through the first input terminal IN1. This means that the role of the Q node pull-up portion 411 and the Q node reset portion 413 is changed. That is, both the Q node pull-up portion 411 and the Q node reset portion 413 operate according to the gate-on voltages (input from the first input terminal IN1 or the second input terminal IN2) applied in the different stages SR, and serve to change the voltage of the Q node to the DC voltage (input from the first DC voltage terminal DI1 or the second DC voltage terminal DI2).

As a result, the gate driver 400 having the structure of FIGS. 2 and 3 may operate in the backward mode by changing the voltages applied to the first DC voltage terminal DI1 and the second DC voltage terminal DI2.

Meanwhile, according to the exemplary embodiment of FIG. 3, the control node of the reset portion 415 is the Q node, and the control node of the reset portion 415 may be formed as the O node, not the Q node.

Hereinafter, in the circuit diagram illustrated in FIG. 3, an example in which the output gate signal of the current stage other than the Q node voltage is input to the third input terminal IN3 will be described.

Figure 5:
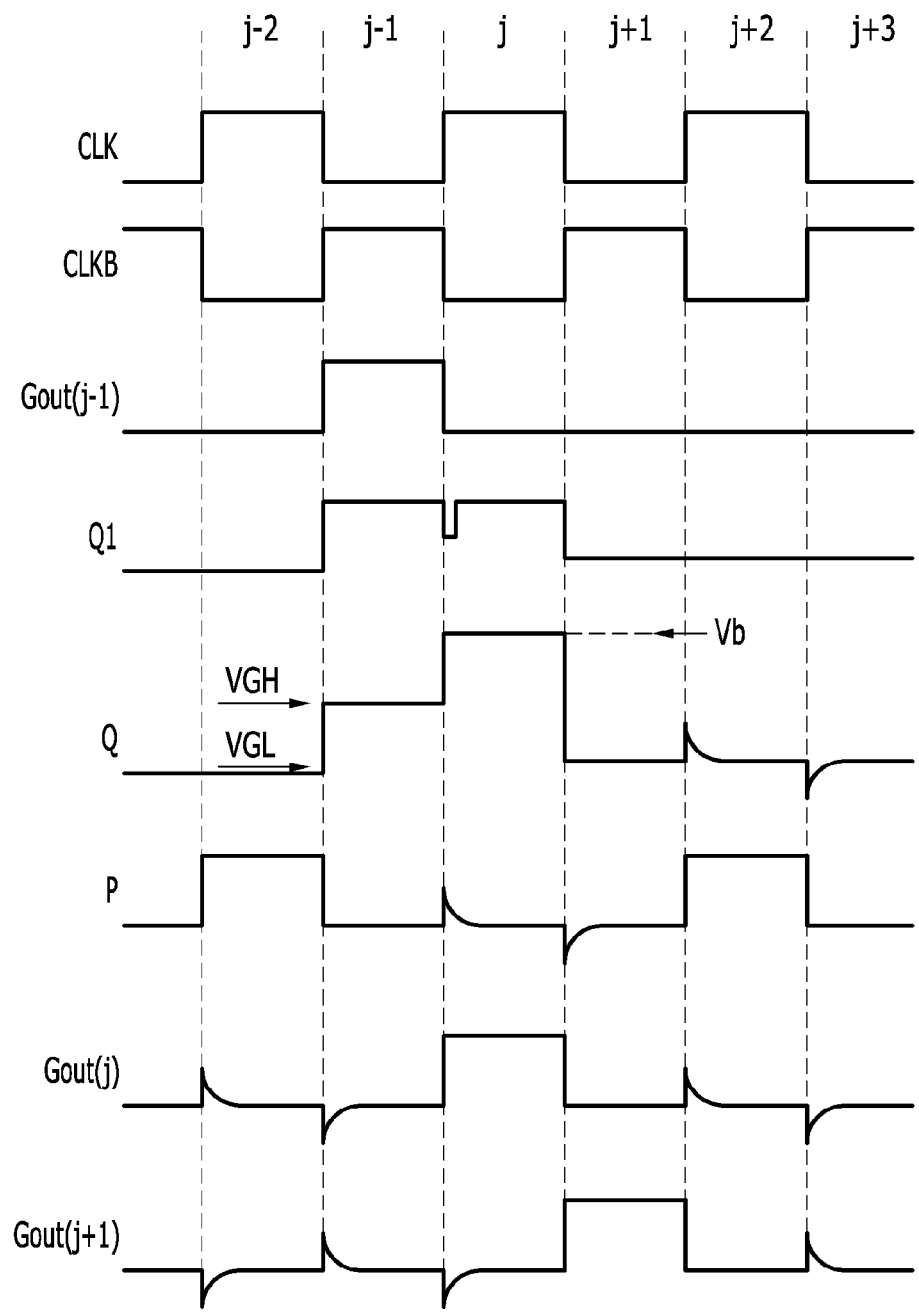
FIG. 5 is a signal waveform diagram according to a Comparative Example.

FIG. 5 is a signal waveform diagram according to a Comparative Example.

The gate driver 400 exemplified in FIG. 2 may be configured to receive the current gate voltage when the third input terminal IN3 is connected to the output terminal OUT of the current stage, so that an output gate signal Gout(j) of the current stage SRj may be input to the third input terminal IN3.

Referring to FIGS. 3 to 5, since the front gate-on voltage is applied through the first input terminal IN1 for a j−1-th period, the high voltage input through the first DC voltage terminal DI1 is applied to the Q1 node via the T1 transistor. The voltage drop of the Q node temporally occurs due to a capacitance of the gate of the T1 transistor in the instant of entering a j-th period, and then the current gate-on voltage input through the third input terminal IN3 is applied to the Q1 node via the diode-connected T12 transistor. Accordingly, the Q1 voltage has a waveform similar to an M letter for the j−1-th or j-th period.

For the j-th period, since the voltage of the Q node is boosted-up to Vb, while the voltage of the Q1 node has substantially the same level as the gate-on voltage or temporarily lower level than the gate-on voltage, a big voltage difference between the Q1 node and the Q node occurs. When the current gate-on voltage is input to the third input terminal IN3, even though the voltage of the Q1 node is stabilized as the gate-on voltage, due to the voltage difference from the Q node, a current is flowing through the transistors T2, T4, and T7 connected between the Q1 node and the Q node. As a result, the voltage value of the Q node is lowered, and thus for example, the T3 transistor of the pull-up driver 412 and the reset portion are not properly controlled. Accordingly, the gate-on voltage may not be applied or turned off at a proper timing. The problem is vulnerable to high-temperature reliability and long-term reliability of the gate driver 400.

Meanwhile, while the P node is in the high voltage state, the low voltage input through the voltage input terminal Vin is applied to the Q node through the Q node pull-down portion 414, and also applied to the O node through the output pull-down portion 416. Accordingly, since there is little voltage difference between the control terminal of the T3 transistor of the pull-up driver 412 and the output terminal, when the clock signal swings, a holding capacity of the Q node deteriorates and thus the clock signal may be vulnerable to the leakage, and as a result, for example, the ripple of the output gate voltage may be increased.

Figure 6:
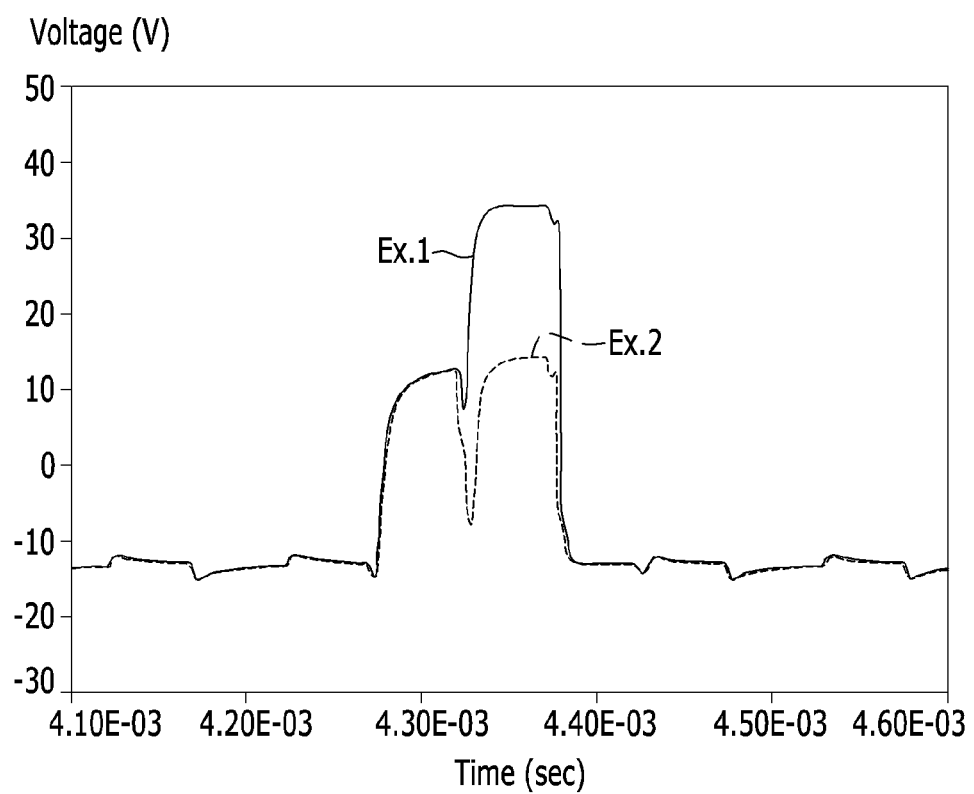
FIG. 6 is a waveform diagram illustrating a simulation result of a voltage of a Q1 node according to a signal input to a third input terminal in the circuit diagram of FIG. 3.

FIG. 6 is a waveform diagram illustrating a simulation result of a voltage of a Q1 node according to a signal input to a third input terminal in the circuit diagram of FIG. 3.

In FIG. 6, a solid line Ex. 1 represents a waveform of the voltage of the Q1 node when the voltage of the Q node is input to the third input terminal IN3, and a dotted line Ex. 2 represents a waveform of the Q1 node voltage when the output gate signal Gout(j) of the current stage SRj is input to the third input terminal IN3. In the case of Ex. 2, the voltage of the Q1 node increases up to about 13 V and then temporarily drops up to about −10 V, and thereafter, increases up to about 14 V. In the case of Ex. 1, the voltage of the Q1 node increases up to about 13 V and then temporarily drops slightly, and thereafter, increases up to about 34 V, and this corresponds to the boost up of the voltage of the Q node. Unlike Ex. 2, in the case of Ex. 1, it can be seen that the voltage difference between the Q1 node and the Q node is decreased or does not almost exist due to the voltage increase of the Q1 node, and as a result, there is little leakage current from the Q node to the Q1 node.

Hereinafter, other exemplary embodiments of the inventive concept will be described with reference to FIGS. 7 to 12.

Figure 7:
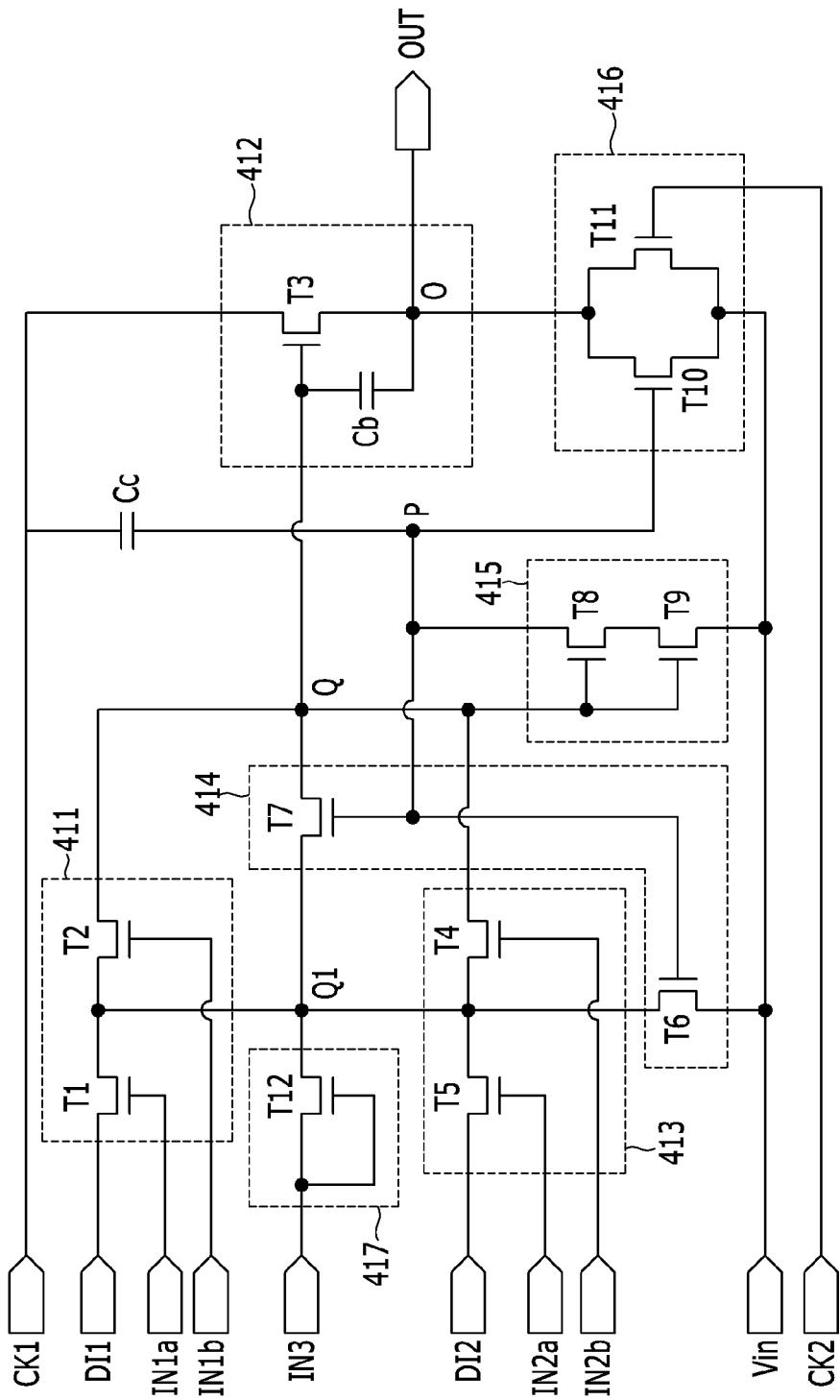
FIG. 7 is a circuit diagram illustrating one stage according to another exemplary embodiment of the inventive concept.
Figure 8:
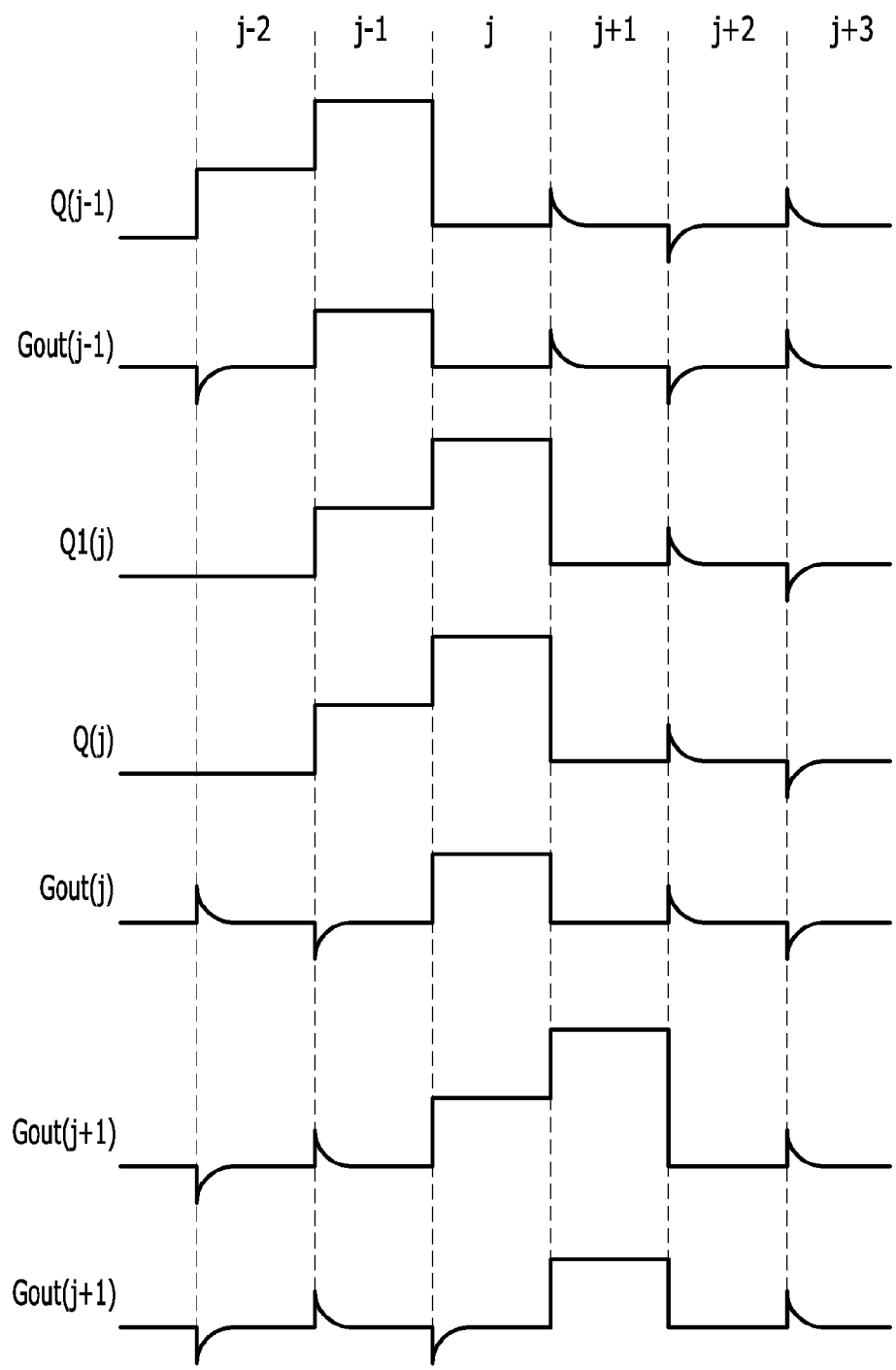
FIG. 8 is a signal waveform diagram related with the stage of FIG. 7.

FIG. 7 is a circuit diagram illustrating one stage according to another exemplary embodiment of the inventive concept, and FIG. 8 is a signal waveform diagram related with the stage of FIG. 7.

In a difference between the exemplary embodiment of FIG. 7 and the exemplary embodiment of FIG. 3, the first input terminal IN1 is divided into two input terminals IN1a and IN1b and different signals are input to the two input terminals IN1a and IN1b, and the second input terminal IN2 is also divided into two input terminals IN2a and IN2b and different signals are input to the two input terminals IN2a and IN2b.

Unlike the exemplary embodiment of FIG. 3 in which one first input terminal IN1 is connected to both the T1 transistor and the T2 transistor of the Q node pull-up portion 411, an input terminal IN1a is connected to the control terminal of the T1 transistor, and an input terminal IN1b is connected to the control terminal of the T2 transistor. The output gate signal Gout(j−1) of the front stage SRj−1 is input to the input terminal IN1a, but a Q node voltage Q(j−1) of the front stage SRj−1 is input to the input terminal IN1b. For the j−1-th period, high-level signals are applied to both the control terminal of the T1 transistor and the control terminal of the T2 transistor, but the high-level signal applied to the control terminal of the T2 transistor is a boosted-up signal.

Similarly to the first input terminals IN1a and IN1b, an input terminal IN2a is connected to the control terminal of the T5 transistor of the Q node reset portion 413, and an input terminal IN2b is connected to the control terminal of the T4 transistor. The output gate signal Gout(j+1) of the rear stage SRj+1 is input to the input terminal IN2a, but a Q node voltage Q(j+1) of the rear stage SRj+1 is input to the input terminal IN2b. For the j+1-th period, high-level signals are applied to both the control terminal of the T4 transistor and the control terminal of the T5 transistor, but the high-level signal applied to the control terminal of the T4 transistor is a boosted-up signal.

Meanwhile, the same signals as the exemplary embodiment of FIG. 3 are input to the rest of the input terminals CK1, CK2, DI1, DI2, Vin, and IN3 of the stage, and for example, the voltage of the Q node of the current stage is input to the third input terminal IN3.

Referring to FIGS. 7 and 8, the boosted-up voltage higher than the gate-on voltage of the front stage is applied to the control terminal of the T2 transistor, and the boosted-up voltage higher than the gate-on voltage of the rear stage is applied to the control terminal of the T4 transistor. Accordingly, the output of the T2 transistor performing the carry output is improved and thus a low-temperature margin may be improved, and the output of the T4 transistor performing the reset is improved and thus the holding capacity may be improved.

Figure 9:
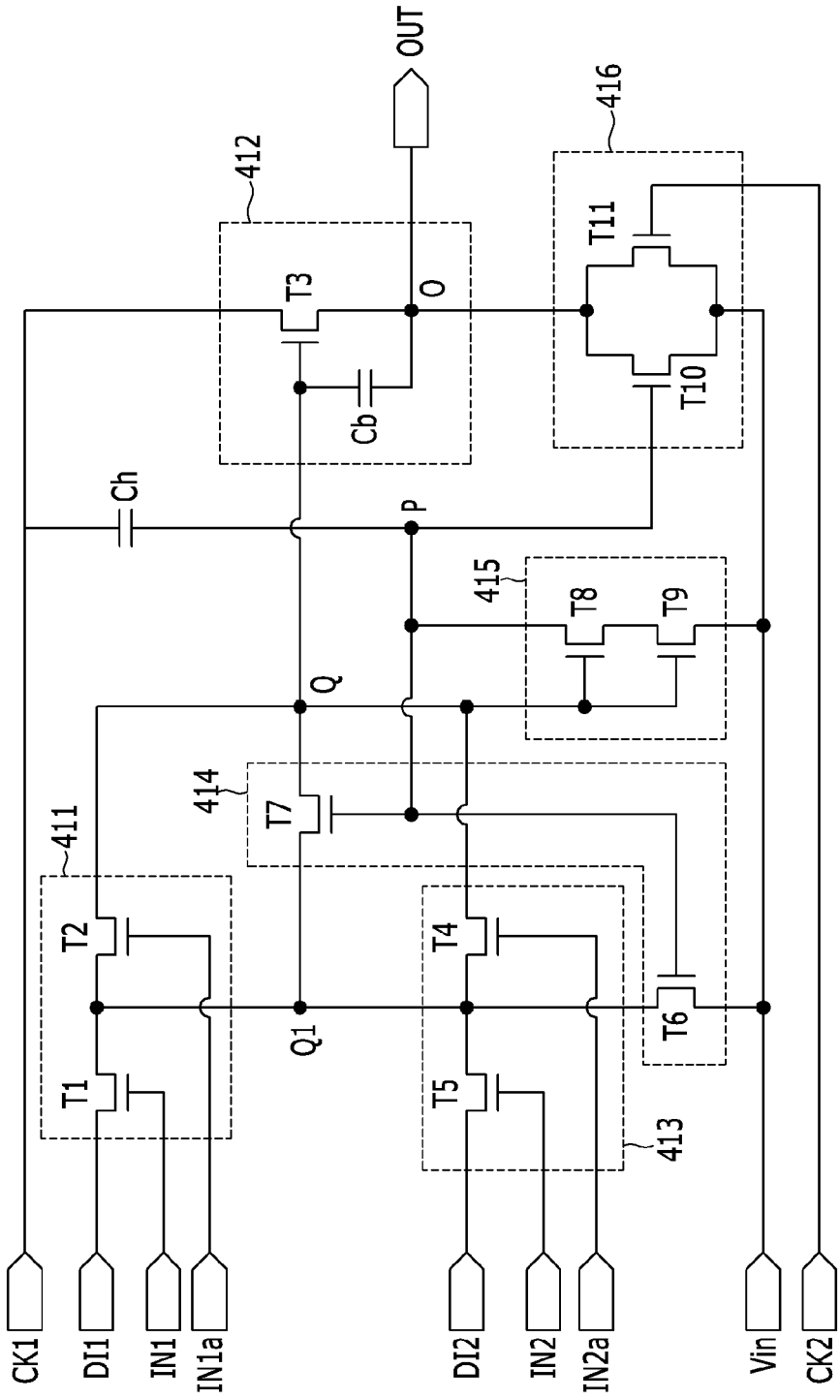
FIG. 9 is a circuit diagram illustrating one stage according to yet another exemplary embodiment of the inventive concept.
Figure 10:
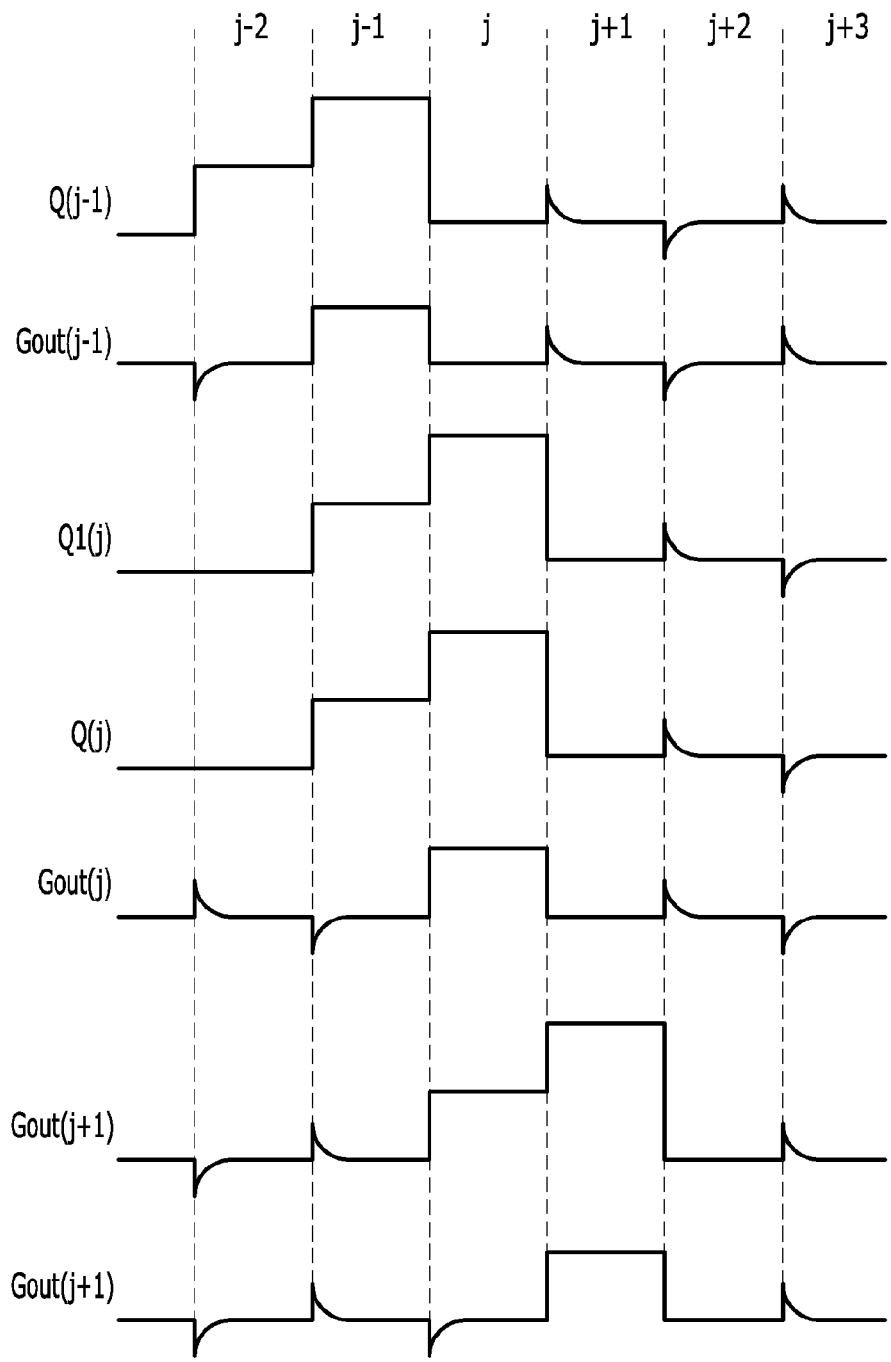
FIG. 10 is a signal waveform diagram related with the stage of FIG. 9.

FIG. 9 is a circuit diagram illustrating one stage according to yet another exemplary embodiment of the inventive concept, and FIG. 10 is a signal waveform diagram related to the stage of FIG. 9.

The exemplary embodiment of FIG. 9 is different from the exemplary embodiment of FIG. 7 in that a stage does not include the buffer node stabilizer 417. That is, the stage does not include the diode-connected T12 transistor, and consists of a total of eleven transistors. In this case, an area of the gate driver 400 to be integrated on the display panel 100 may be reduced.

Since a voltage of the Q node Q(j+1) of a subsequent stage is applied to the control terminal of the T4 transistor of the Q node reset portion 413, the high-level signal is applied to the control terminal of the T4 transistor for both the j+1-th period and the j-th period. Accordingly, since the T4 transistor is turned on for the j-th period, while the current stage SRj operates, the voltage of the Q1 node may be maintained substantially the same as the voltage of the Q node, and no or little leakage current may flow through the transistors T2, T4, and T7 connected between the Q1 node and the Q node. Meanwhile, since a boosted-up voltage more than gate-on voltage is applied to the control terminal of the T2 transistor of the Q node pull-up portion 411 and the control terminal of the T4 transistor of the Q node reset portion 413, respectively, as described above, the output of the corresponding transistor is improved, and as a result, the low-temperature margin and the holding capacity may be improved.

Figure 11:
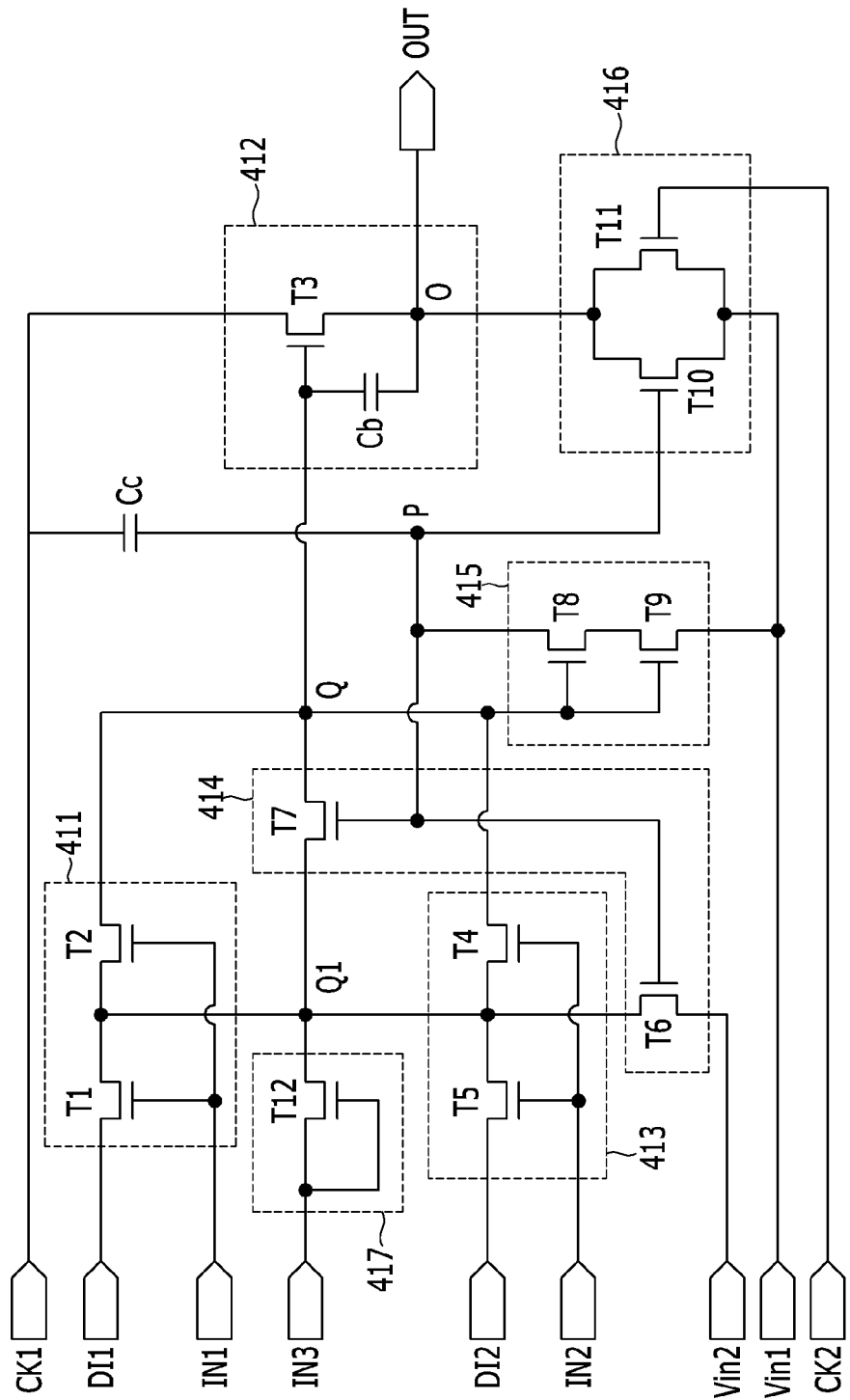
FIGS. 11 and 12 are circuit diagrams illustrating one stage according to other exemplary embodiments of the inventive concept.
Figure 12:
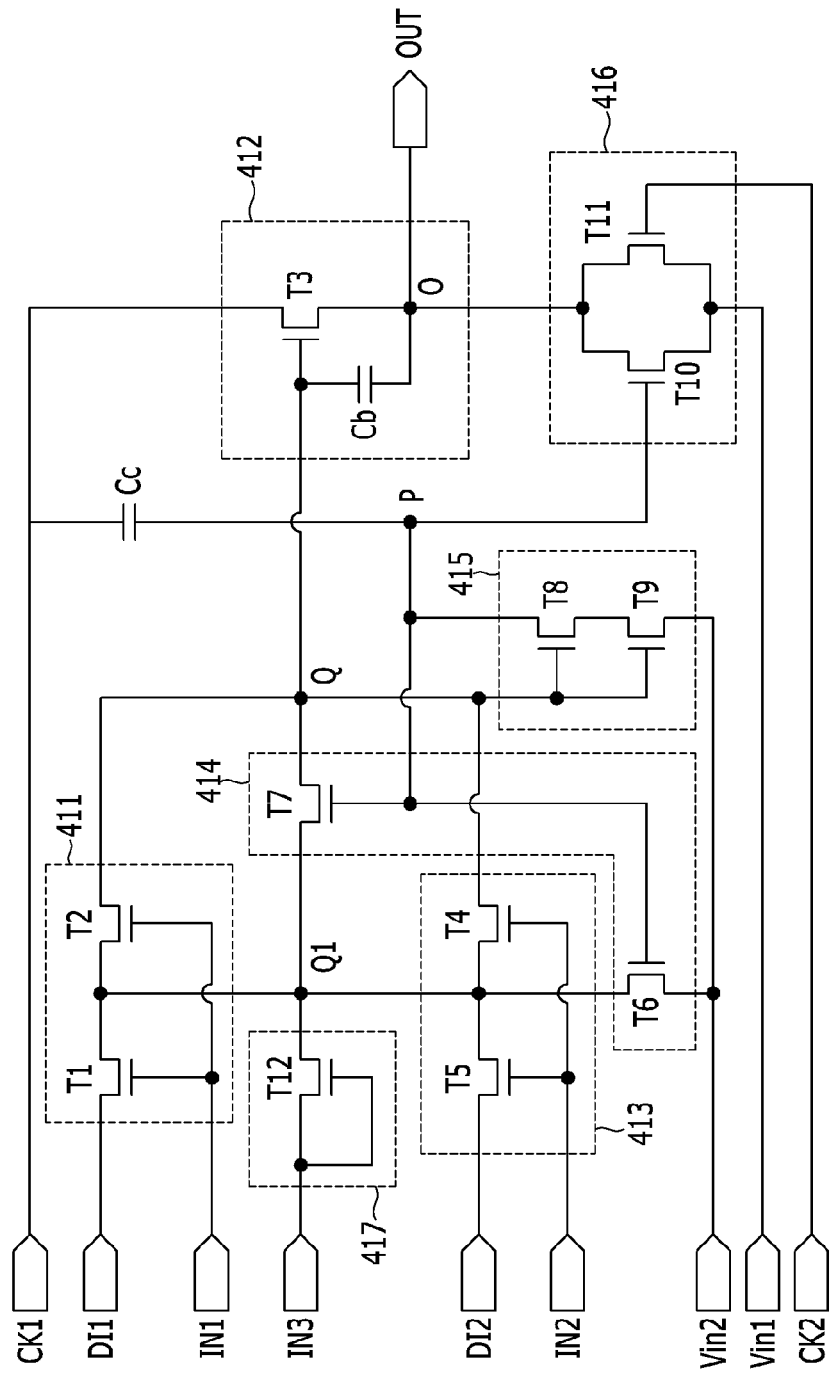

FIGS. 11 and 12 are circuit diagrams illustrating one stage according to other exemplary embodiments of the inventive concept.

The exemplary embodiments of FIGS. 11 and 12 are configured so that the voltage input terminal Vin is divided into two voltage input terminals Vin1 and Vin2, and a voltage lower than the low voltage applied to the voltage input terminal Vin1 is applied to the second voltage input terminal Vin2. For example, the low voltage applied to the second voltage input terminal Vin2 may be lower than the low voltage applied to the first voltage input terminal Vin1 by about 1 V or more. Others are the same as the exemplary embodiment of FIG. 3.

First, referring to FIG. 11, the first voltage input terminal Vin1 is connected to the output terminal of the T10 transistor and the output terminal of the T11 transistor of the output pull-down portion 416, and the output terminal of the T9 transistor of the reset portion 415. The second voltage input terminal Vin2 is connected to the output terminal of the T6 transistor of the Q node pull-down portion 414. The low voltages are applied to both the first voltage input terminal Vin1 and the second voltage input terminal Vin2, but since the voltage applied to the second voltage input terminal Vin2 is lower than the voltage applied to the first voltage input terminal Vin1, while the P node is in a high voltage state, the voltage of the Q node corresponding to the control terminal of the T3 transistor is maintained to be lower than the voltage of the O node corresponding to the output terminal of the T3 transistor. Accordingly, the holding capacity of the Q node is increased and thus the leakage through the T3 transistor may be improved.

The exemplary embodiment of FIG. 12 is only different from the exemplary embodiment of FIG. 11 in that the second voltage input terminal Vin2 rather than the first voltage input terminal Vin1 is connected to the output terminal of the T9 transistor of the reset portion 415. Similarly, while the P node is in the high voltage state, the voltage of the Q node may be maintained to be lower than the voltage of the O node.

In the exemplary embodiments of FIGS. 11 and 12, in order to remove or at least reduce the voltage difference between the Q node and Q1 node, a voltage of the Q node Q(j) of the current stage is input to the third input terminal IN3. According to an exemplary embodiment, the output gate signal Gout(j) of the current stage rather than the voltage of the Q node Q(j) of the current stage may be input to the third input terminal IN3, and as a result, the buffer node stabilizer 417 may transfer the gate-on voltage of the current stage to the Q1 node. The buffer node stabilizer of the exemplary embodiment of FIG. 11 and FIG. 12 may be omitted and the same operation method as disclosed in FIG. 9 and FIG. 10 may be employed to the exemplary embodiment of FIG. 11 and FIG. 12.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A gate driver including a plurality of stages respectively transferring gate-on voltages to a plurality of gate lines, wherein a stage comprises:
   a pull-up driver including a first transistor, the first transistor having a control terminal connected to a first node, an output terminal connected to an output terminal of a present stage and an input terminal connected to a first clock terminal;
   a first node pull-down portion including a second transistor, the second transistor having an input terminal connected to a buffer node, an output terminal connected to the first node and a control terminal connected to a second node; and
   a buffer node stabilizer including a third transistor, the third transistor having an input terminal and a control terminal connected to an input terminal which is directly connected to the first node of the present stage, and an output terminal connected to the buffer node.

2. The gate driver of claim 1, the stage further comprises:
   a first node pull-up portion having a seventh transistor and a eighth transistor serially connected, wherein the seventh transistor having an input terminal connected to a first DC voltage input terminal, an output terminal connected to an input terminal of the eighth transistor and a control terminal connected to an output terminal of a previous stage, and wherein the eighth transistor having an input terminal connected to the output terminal of the seventh transistor, an output terminal connected to the first node and a control terminal connected to a first node of the previous stage.

3. The gate driver of claim 2, the stage further comprises:
a first node reset portion having a ninth transistor and a tenth transistor serially connected, wherein the ninth transistor having an input terminal connected to a second DC voltage input terminal, an output terminal connected to an input terminal of the tenth transistor and a control terminal connected to an output terminal of a subsequent stage, and wherein the tenth transistor having an input terminal connected to the output terminal of the ninth transistor, an output terminal connected to the first node of the present stage and a control terminal connected to a first node of the subsequent stage.

4. The gate driver of claim 1, the stage further comprises:
a first node reset portion having a ninth transistor and a tenth transistor serially connected, wherein the ninth transistor having an input terminal connected to a second DC voltage input terminal, an output terminal connected to an input terminal of the tenth transistor and a control terminal connected to an output terminal of a subsequent stage, and wherein the tenth transistor having an input terminal connected to the output terminal of the ninth transistor, an output terminal connected to the first node and a control terminal connected to a first node of the subsequent stage.

5. A gate driver including a plurality of stages respectively transferring gate-on voltages to a plurality of gate lines, wherein a stage comprises:
a pull-up driver including a first transistor, the first transistor having a control terminal connected to a first node, an output terminal connected to an output terminal of a present stage and an input terminal connected to a first clock terminal;
a first node pull-down portion including a second transistor, the second transistor having an input terminal connected to a buffer node, an output terminal connected to the first node and a control terminal connected to a second node; and
a first node reset portion having a third transistor and a fourth transistor serially connected, wherein the third transistor having an input terminal connected to a second DC voltage input terminal, an output terminal connected to an input terminal of the fourth transistor and a control terminal connected to an output terminal of a subsequent stage, and wherein the fourth transistor having an input terminal connected to an output terminal of the third transistor, an output terminal connected to the first node and a control terminal directly connected to a first node of the subsequent stage.

6. A gate driver including a plurality of stages respectively transferring gate-on voltages to a plurality of gate lines, wherein a stage comprises:

a pull-up driver including a first transistor and a capacitor, the first transistor having a control terminal connected to a first node, an output terminal connected to an output terminal of a present stage and an input terminal connected to a first clock terminal, the capacitor being connected between the first node and the output terminal of the present stage;
a first node pull-down portion including a second transistor and a third transistor, the second transistor having an input terminal connected to a buffer node, an output terminal connected to the first node and a control terminal connected to a second node, the third transistor having an input terminal connected to a buffer node, an output terminal connected to a low voltage input terminal and a control terminal connected to a second node;
a buffer node stabilizer including a fourth transistor, the fourth transistor having an input terminal and a control terminal connected to an input terminal which is directly connected to the first node of the present stage, and an output terminal connected to the buffer node;
an output pull-down portion having a fifth transistor, the fifth transistor having an input terminal connected to the output terminal of the stage, an output terminal connected to the low voltage input terminal and a control terminal connected to a second clock terminal having an opposite phase to the first clock terminal;
a reset portion including a sixth transistor, the sixth transistor having an input terminal connected to the second node, an output terminal connected to the low voltage input terminal and a control terminal connected to the first node;
a first node pull-up portion having a seventh transistor and a eighth transistor serially connected, wherein the seventh transistor having an input terminal connected to a first DC voltage input terminal, an output terminal connected to an input terminal of the eighth transistor and a control terminal connected to an output terminal of a previous stage, and wherein the eighth transistor having an input terminal connected to the output terminal of the seventh transistor, an output terminal connected to the first node and a control terminal connected to a first node of the previous stage; and
a first node reset portion having a ninth transistor and a tenth transistor serially connected, wherein the ninth transistor having an input terminal connected to a second DC voltage input terminal, an output terminal connected to an input terminal of the tenth transistor and a control terminal connected to an output terminal of a subsequent stage, and wherein the tenth transistor having an input terminal connected to the output terminal of the ninth transistor, an output terminal connected to the first node of the present stage and a control terminal directly connected to a first node of the subsequent stage.

\* \* \* \* \*